(12) United States Patent
Woo

(10) Patent No.: US 10,146,709 B2
(45) Date of Patent: Dec. 4, 2018

(54) MEMORY SYSTEM AND OPERATING METHOD THEREOF

(71) Applicant: SK hynix Inc., Gyeonggi-do (KR)

(72) Inventor: Chan-Jong Woo, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/666,739

(22) Filed: Aug. 2, 2017

(65) Prior Publication Data

US 2018/0173650 A1    Jun. 21, 2018

(30) Foreign Application Priority Data

Dec. 16, 2016 (KR) .......................... 10-2016-0172387

(51) Int. Cl.
| | |
|---|---|
| G11C 7/00 | (2006.01) |
| G06F 13/16 | (2006.01) |
| G11C 8/18 | (2006.01) |
| G06F 13/42 | (2006.01) |
| G11C 7/22 | (2006.01) |
| G11C 5/04 | (2006.01) |

(52) U.S. Cl.
CPC ...... *G06F 13/1636* (2013.01); *G06F 13/4243* (2013.01); *G11C 7/222* (2013.01); *G11C 8/18* (2013.01); *G11C 5/04* (2013.01)

(58) Field of Classification Search
CPC ....... G11C 7/22; G11C 7/1066; G11C 7/1051; G11C 7/1078; G11C 11/4076

USPC .................. 365/193, 189.14, 189.15, 189.16
See application file for complete search history.

(56) References Cited

U.S. PATENT DOCUMENTS

| | | | |
|---|---|---|---|
| 8,966,151 B2 * | 2/2015 | Zitlaw | G06F 1/10 710/305 |
| 2011/0238866 A1 | 9/2011 | Zitlaw | |
| 2014/0355367 A1 * | 12/2014 | Gay | G11C 7/222 365/193 |

FOREIGN PATENT DOCUMENTS

KR         1020160009523         1/2016

* cited by examiner

*Primary Examiner* — Son Dinh
(74) *Attorney, Agent, or Firm* — IP & T Group LLP

(57) ABSTRACT

A method for operating a memory system including a memory controller and a memory module, the method includes: by the memory controller, applying a read command to the memory module; by the memory module, determining whether the memory module is able to transfer the read data to the memory controller during a regulated section; by the memory module, notifying the memory controller by using a data strobe signal that the memory module is not able to transfer the read data to the memory controller during the regulated section; by the memory controller, applying a status check-out command to the memory module in response to the notification for checking out a status of the memory module; and by the memory module, transferring status information of the memory module to the memory controller in response to the status check-out command.

19 Claims, 4 Drawing Sheets

MEMORY SYSTEM AND OPERATING METHOD THEREOF

CROSS-REFERENCE TO RELATED APPLICATIONS

The present application claims priority of Korean Patent Application No. 10-2016-0172387, filed on Dec. 16, 2016, which is incorporated herein by reference in its entirety.

BACKGROUND

1. Field

Exemplary embodiments of the present invention relate to a memory system.

2. Description of the Related Art

Recently, as mobile communication devices such as smart phones and tablet personal computer (PC) are widely disseminated, and the use of Social Network Service (SNS), a Machine to Machine (M2M) network, and a sensor network is increased, the amount of data, the rate of data generation, and the diversity of data are increasing geometrically.

To process big data, not only the operation speed of a memory system is important, but also the memory capacity of individual memory devices and the memory capacity of a memory module including the memory devices are required to be great. In the past, it was typical to include a Dynamic Random Access Memory (DRAM) device, which is a high-speed memory device, in a memory module used as a system memory. Nowadays, to cope with the increasing demand for high capacity, researchers and the industry are trying to include non-volatile memory devices having high capacity, such as a NAND flash memory, a Phase-Change Random Access Memory (PCRAM) and the like, as well in a memory module. In this case, since the non-volatile memory devices which operate relatively slowly are included in the memory module, the latency rule for a memory module may not be fulfilled frequently. Therefore, it is required to address this concern.

SUMMARY

Embodiments of the present invention are directed to a technology for addressing the latency concern of a memory module including a plurality of memory devices of at least two different types.

In accordance with an embodiment of the present invention, a method for operating a memory system including a memory controller and a memory module, the method may include: by the memory controller, applying a read command to the memory module; by the memory module, determining whether the memory module is able to transfer the read data to the memory controller during a regulated section; by the memory module, notifying the memory controller by using a data strobe signal that the memory module is not able to transfer the read data to the memory controller during the regulated section; by the memory controller, applying a status check-out command to the memory module in response to the notification for checking out a status of the memory module; and by the memory module, transferring status information of the memory module to the memory controller in response to the status check-out command.

The regulated section may range from a first moment when a read latency RL elapses from when the read command is applied to a second moment when a burst length BL elapses from the first moment.

In notifying the memory controller that the memory module is not able to transfer the read data to the memory controller during the regulated section by using the data strobe signal, the memory module may fix the data strobe signal for a time of at least one clock within the regulated section.

The status information may include information on the reason why the memory module does not transfer the read data to the memory controller during the regulated section, information on whether it is possible/impossible to transfer the read data, and information on a moment when the read data may be transferred if possible.

In accordance with another embodiment of the present invention, a method for operating a memory system includes: in a memory controller, applying a read command to a memory module; when the memory module is not able to transfer a read data to the memory controller during a regulated section, in the memory module, notifying the memory controller that the memory module is not able to transfer the read data to the memory controller during the regulated section by using a data strobe signal; and in the memory module, transferring status information of the memory module to the memory controller after the notification.

The regulated section may range from a first moment when a read latency RL elapses from when the read command is applied to a second moment when a burst length BL elapses from the first moment.

In notifying the memory controller that the memory module is not able to transfer the read data to the memory controller during the regulated section by using the data strobe signal, the memory module may fix the data strobe signal during a portion of the regulated section.

The transferring of the status information of the memory module to the memory controller from the memory module after the notification may be performed during a remaining portion of the regulated section.

The status information may be transferred through a data strobe signal transfer line.

The status information may be transferred through a data transfer line.

In accordance with yet another embodiment of the present invention, a memory system includes: a memory module suitable for including a plurality of memory devices and a module controller for controlling the plurality of the memory devices; and a memory controller suitable for commanding an operation of the memory module, wherein, during a read operation of the memory module under a control of the module controller, when the memory module is not able to transfer a read data to the memory controller in a regulated section during a read operation, the module controller notifies the memory controller that the memory module is not able to transfer the read data to the memory controller during the regulated section by using a data strobe signal.

The regulated section may range from a first moment when a read latency RL elapses from when the memory controller commands the memory module to perform the read operation to a second moment when a burst length BL elapses from the first moment.

The module controller notifies the memory controller that the memory module is not able to transfer the read data to the memory controller during the regulated section by fixing the data strobe signal for at least one or more clock period within the regulated section.

The memory controller may apply a status check-out command to the module controller to check out a status of the memory module, in response to the notification.

The notification that the memory module is not able to transfer the read data to the memory controller during the regulated section may be performed by the module controller fixing the data strobe signal during a portion of the regulated section, and the module controller may transfer status information of the memory module to the memory controller in a remaining portion of the regulated section.

The status information may be transferred through a data strobe signal transfer line.

The status information may be transferred through a data transfer line.

DETAILED DESCRIPTION

Figure 1:
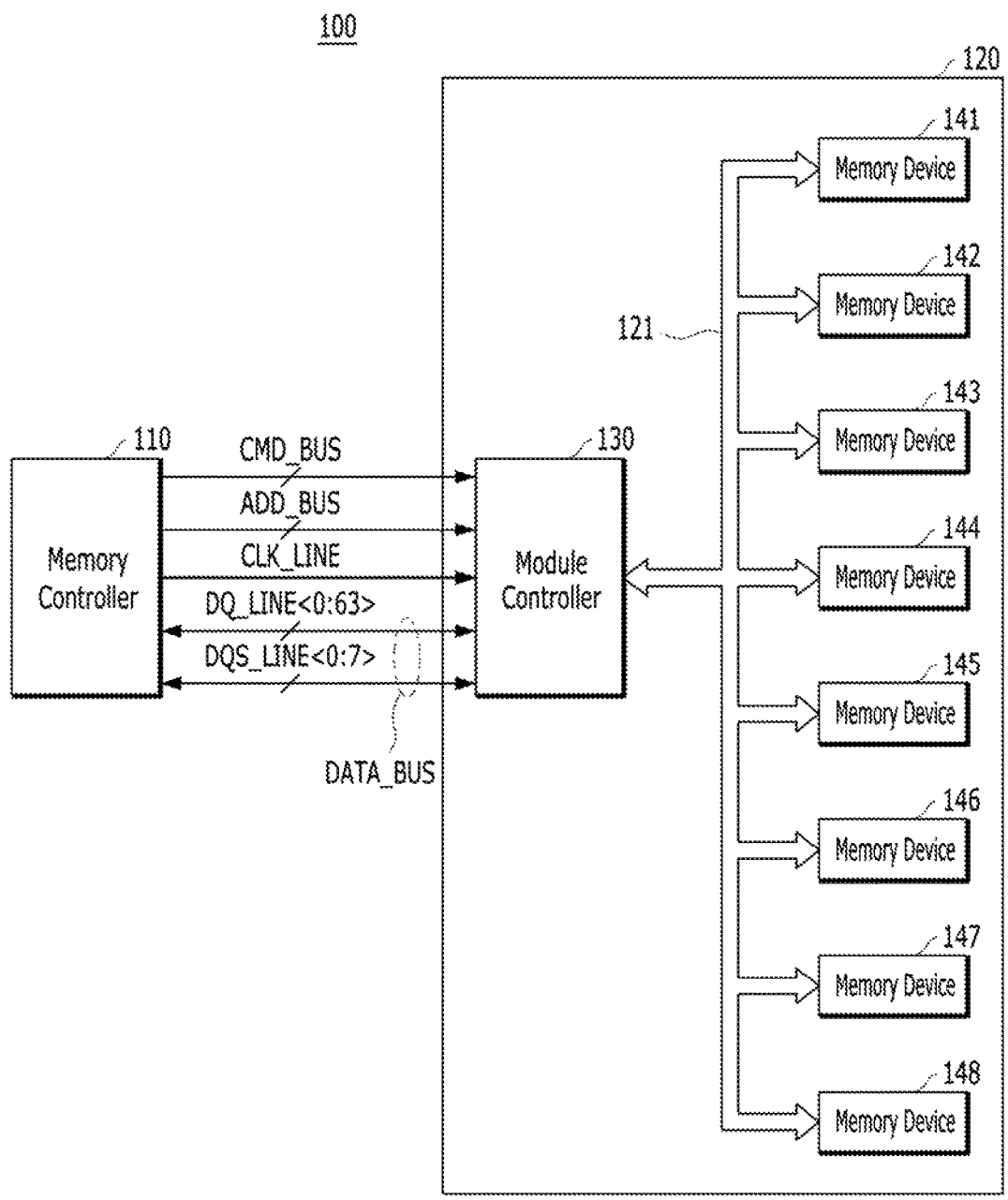
FIG. 1 is a block diagram illustrating a memory system in accordance with an embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and, in some instances, proportions may have been exaggerated in order to more clearly illustrate the various elements of the embodiments. It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The phrase "at least one of . . . and . . . ," when used herein with a list of items, means a single item from the list or any combination of items in the list. For example, "at least one of A, B, and C" means, only A, or only B, or only C, or any combination of A, b, and C.

Spatially relative terms, such as "under," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in manufacturing, use or operation in addition to the orientation depicted in the figures. For example, if the device in the figures is turned over, elements described as "below" or "under" other elements or features would then be "above" the other elements or features. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, singular forms are intended to include the plural forms as well, unless the context clearly indicates otherwise. It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs in view of the present disclosure. It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, an element (also referred to as a feature) described in connection with one embodiment may be used singly or in combination with other elements of another embodiment, unless specifically indicated otherwise.

Hereinafter, the various embodiments of the present invention will be described in detail with reference to the attached drawings.

FIG. 1 is a block diagram illustrating a memory system 100 in accordance with an embodiment of the present invention.

Referring to FIG. 1, the memory system 100 may include a memory controller 110 and a memory module 120.

The memory controller 110 may transfer a command to the memory module 120 through a command bus CMD_BUS, and transfer an address to the memory module 120 through an address bus ADD_BUS. Also, the memory controller 110 may transfer data to be written (hereinafter, referred to as "write data") to the memory module 120, and receive data (hereinafter, referred to as "read data") read from the memory module 120, through a data bus DATA_BUS. The memory controller 110 may command the memory module 120 to perform a write operation and a read operation by applying the command and the address to the memory module 120, and transfer the write data to the memory module 120 during the write operation, and receive the read data from the memory module 120 during the read operation. Meanwhile, the memory controller 110 may transfer a clock to be used in the memory module 120 through a clock line CLK_LINE. The signal transfer between the memory controller 110 and the memory module 120 may be performed based on double data rate (DDR) physical layer (PHY) Interface (DFI) Standard Protocol.

The data bus DATA_BUS may include a plurality of data transfer lines DQ_LINE<0:63> and a plurality of data strobe signal transfer lines DQS_LINE<0:7>. Data may be transferred through the data transfer lines DQ_LINE<0:63>, and data strobe signals for strobing the data that are transferred through the data transfer lines DQ_LINE<0:63> may be transferred through the data strobe signal transfer lines DQS_LINE<0:7>. FIG. 1 exemplarily shows 64 data transfer lines DQ_LINE<0:63> and 8 data strobe signal transfer lines DQS_LINE<0:7>. A data strobe signal that is transferred through one data strobe signal transfer line may strobe data that are transferred through 8 data transfer lines. For example, a data strobe signal transferred through the data strobe signal transfer line DQS_LINE<0> may strobe data that are transferred through the data transfer lines DQ_LINE<0:7>, and a data strobe signal transferred through the data strobe signal transfer line DQS_LINE<1> may strobe data that are transferred through the data transfer lines DQ_LINE<8:15>.

The memory module 120 may include a module controller 130 and a plurality of memory devices 141 to 148. The plurality of memory devices 141 to 148 may be any suitable memory devices such as, for example, DRAM PCRAM, and a NAND flash memory devices. The memory devices 141 to 148 may include the same type of memory devices, or two or more types of memory devices. For example, the memory devices 141 to 146 may be Dynamic Random Access Memory (DRAM) devices, and the memory devices 147 and 148 may be PCRAM devices or NAND flash memory devices.

The module controller 130 may receive the command and the address from the memory controller 110 through the command bus CMD_BUS and the address bus ADD_BUS, and transfer/receive the write data and the read data to/from the memory controller 110 through the data bus DATA_BUS. Also, the module controller 130 may receive the clock from the memory controller 110 through the clock line CLK_LINE. The module controller 130 may transfer the command and the address to the memory devices 141 to 148 through an internal bus 121 in the memory module 120, transfer write data to the memory devices 141 to 148 and receive read data from the memory devices 141 to 148, so as to control the memory devices 141 to 148 to perform a write operation and a read operation. The module controller 130 may not only serve as an interface between the memory devices 141 to 148 and the memory controller 110, but may also perform an error correcting operation for correcting an error that occurs in the memory devices 141 to 148. The transfer of the command, the address, and the data between the module controller 130 and the memory devices 141 to 148 may be performed based on the same protocol as that of the transfer of the command, the address, and the data between the module controller 130 and the memory controller 110, or based on a different protocol from that of the transfer of the command, the address, and the data between the module controller 130 and the memory controller 110. For example, the transfer of the command, the address, and the data between DRAM devices among the memory devices 141 to 148 and the module controller 130 may be performed based on a protocol which is the same as or similar to that of the transfer of the command, the address, and the data between the module controller 130 and the memory controller 110, but the transfer of the command, the address, and the data between PCRAM devices or NAND flash memory devices among the memory devices 141 to 148 and the module controller 130 may be performed based on a protocol that is different from the protocol of the transfer of the command, the address, and the data between the module controller 130 and the memory controller 110.

Figure 2:
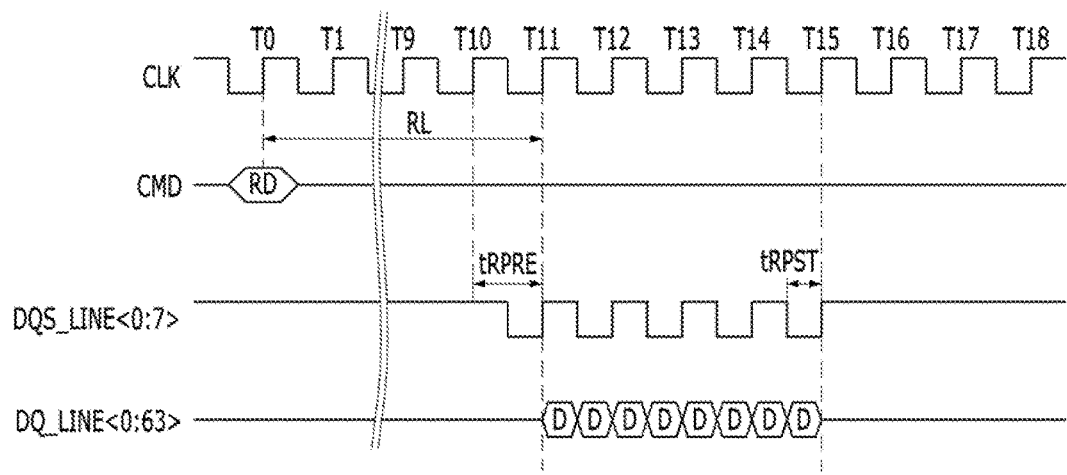
FIG. 2 is a timing diagram illustrating a read operation of the memory system shown in FIG. 1.

FIG. 2 is a timing diagram illustrating a read operation of the memory system 100 shown in FIG. 1.

Referring to FIG. 2, a read command RD may be applied from the memory controller 110 to the memory module 120 at a moment T0. Although not illustrated in the drawing, an address for selecting a region where a read operation is to be performed may be applied along with the read command RD.

Read data D may be transferred from the memory module 120 to the memory controller 110 through the 64 data transfer lines DQ_LINE<0:63> in synchronization with data strobe signals that are transferred through the 8 data strobe signal transfer lines DQS_LINE<0:7> at a moment T11 when a time corresponding to a read latency RL (e.g., '11') elapses from the moment T0. Herein, it is exemplarily illustrated that a burst length BL is '8' and the read data D is outputted during four clock periods.

In FIG. 2, 'tRPRE' represents a preamble of a data strobe signal, and 'tRPST' represents a postamble of the data strobe signal.

FIG. 2 shows an operation when there is no problem in transferring read data from the memory module 120 to the memory controller 110 in a prescribed section that the memory module 120 is supposed to transfer the read data to the memory controller 110. The prescribed section is a section ranging from the moment T11 when the time corresponding to the read latency RL elapses from the moment T0 when the read command RD is applied, to a moment T15 when transferring of the read data corresponding to the burst length BL is completed. In short, FIG. 2 illustrates an operation when a read operation may be normally performed.

Figure 3:
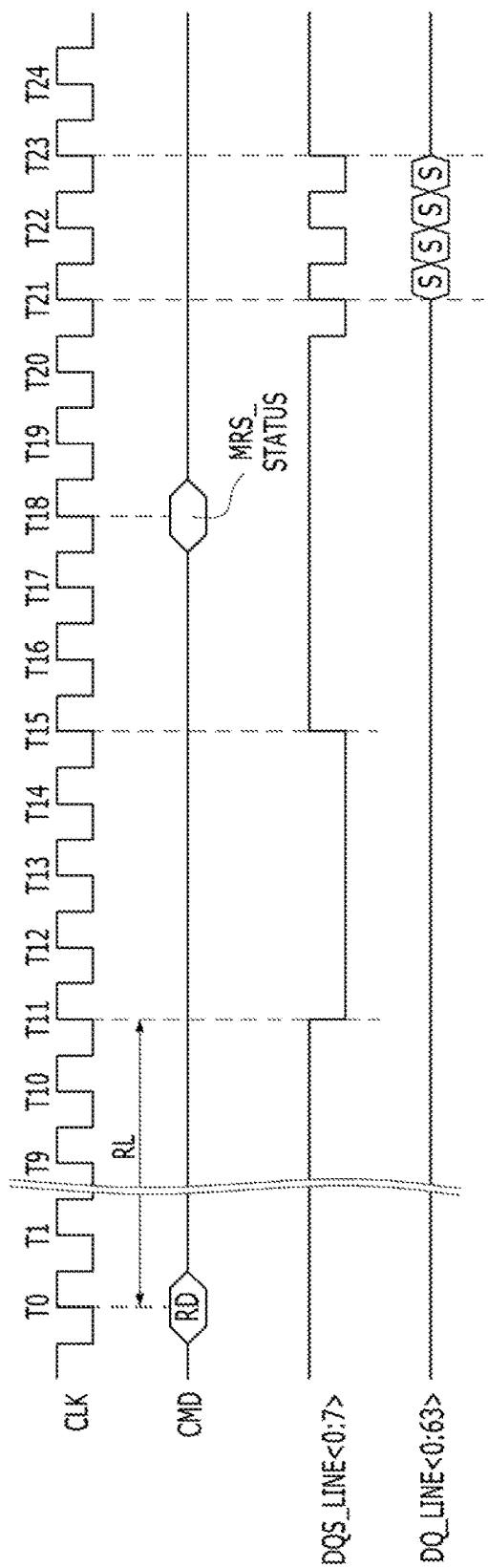
FIG. 3 is a timing diagram illustrating a method for a case that it is impossible for a memory module to transfer read data to a memory controller within a regulated section during a read operation of the memory system shown in FIG. 1, in accordance with an embodiment of the present invention.
Figure 4:
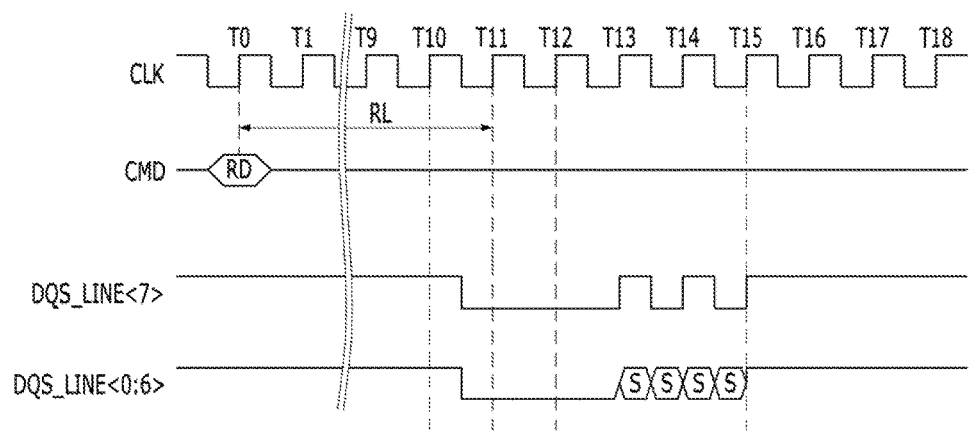
FIG. 4 is a timing diagram illustrating a method for a case that it is impossible for a memory module to transfer read data to a memory controller within a regulated section during a read operation of the memory system shown in FIG. 1, in accordance with an embodiment of the present invention.
Figure 5:
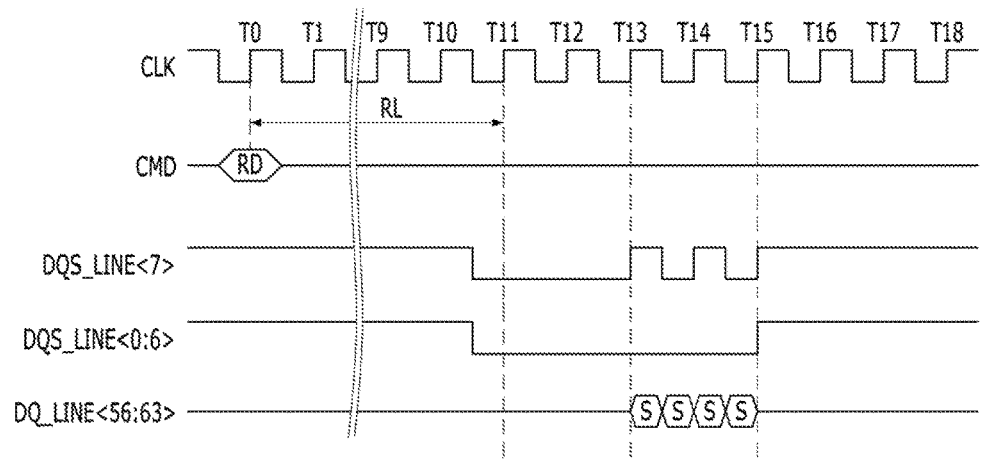
FIG. 5 is a timing diagram illustrating a method for a case that it is impossible for a memory module to transfer read data to a memory controller within a regulated section during a read operation of the memory system shown in FIG. 1, in accordance with an embodiment of the present invention.

When it is impossible to transfer the read data within the prescribed section from the moment T11 to the moment T15, in which the memory module 120 is supposed to transfer the read data to the memory controller 110, one among the methods illustrated in FIGS. 3 to 5 may be used.

FIG. 3 is a timing diagram illustrating a method for a case that it is impossible for the memory module 120 to transfer read data to the memory controller 110 within a regulated section during a read operation of the memory system 100 shown in FIG. 1, in accordance with a first embodiment of the present invention.

Referring to FIG. 3, the read command RD may be applied from the memory controller 110 to the memory module 120 at the moment T0. Herein, although not illustrated in the drawing, an address for selecting a region where a read operation is to be performed may be applied along with the read command RD.

Data strobe signals transferred through the data strobe signal transfer lines DQS_LINE<0:7> may toggle in a prescribed section (i.e., the regulated section), from the moment T11 when a time corresponding to the read latency RL elapses from the moment T0, to the moment T15, and read data may have to be transferred through the data transfer lines DQ_LINE<0:63> in synchronization with the toggling data strobe signals. However, when the memory module 120 is not able to transfer the read data to the memory controller 110 in the regulated section ranging from the moment T11 to the moment T15, the module controller 130 of the memory module 120 may notify the memory controller 110 by not toggling, the data strobe signals transferred through the data strobe signal transfer lines DQS_LINE<0:7> but fixing the data strobe signals for at least one clock. Although FIG. 3 exemplarily illustrates the data strobe signals being fixed at a low level, the data strobe signals may be fixed at high levels. The data strobe signals being fixed at low levels during the regulated section ranging from the moment T11 to the moment T15 represent that the memory module 120 cannot transfer the read data to the memory controller 110. Herein, it is not required to fix all the data strobe signals at low levels. Although the level of one data strobe signal is fixed at a low level, the memory controller 110 may be able to recognize it. Also, it is not required to fix the levels of the data strobe signals at low levels continuously during the regulated section ranging from the moment T11 to the moment T15. Even if the levels of the data strobe signals are fixed at low levels for at least one clock clock period, the memory controller 110 may be able to recognize it.

Based on the levels of the data strobe signals being fixed during the regulated section ranging from the moment T11 to the moment T15, the memory controller 110 may check that the memory module 120 does not transfer the read data. At a moment T18 after it is checked that the memory module 120 does not transfer the read data, the memory controller 110 may apply a status check-out command MRS_STATUS for checking out the status of the memory module 120 to the memory module 120. The status check-out command MRS_STATUS may be applied from the memory controller 110 to the memory module 120 by applying an MRS command through the command bus CMD_BUS and transferring an address for inquiring the reason why the memory module 120 does not transfer the read data, through the address bus ADD_BUS.

At a moment T21 when a predetermined time elapses from the moment T18, status information S may be transferred from the module controller 130 of the memory module 120 to the memory controller 110. The status information S may be transferred through the data transfer lines DQ_LINE<0:63>. Also, in order to strobe the status information S transferred through the data transfer lines DQ_LINE<0:63>, the data strobe signals of the data strobe signal transfer lines DQS_LINE<0:7> may toggle. Since the information amount of the status information S may not be great, it may not have to use all of the data transfer lines DQ_LINE<0:63>. For example, the status information S may be transferred through only one data transfer line DQ_LINE<0> among the data transfer lines DQ_LINE<0: 63>, and only the data strobe signal of one data strobe signal transfer line DQS_LINE<0> among the data strobe signal transfer lines DQS_LINE<0:7> may toggle in order to strobe the transferred status information S.

There may be diverse reasons why the memory module 120 does not transfer the read data to the memory controller 110 during the regulated section T11 to T15. For example, there are cases (1) when it takes a long time for a read operation of a particular memory device among the memory devices 141 to 148, (2) when there are errors in the read data that are read from the memory devices 141 to 148 and it takes a relatively long time to correct the errors, (3) when there are errors in the read data that are read from the memory devices 141 to 148 and it is difficult to correct the errors at all, and (4) when errors occur in the read operations of some memory devices among the memory devices 141 to 148 and a read retry operation needs to be performed.

The status information S may include information on the reason why the memory module 120 does not transfer the read data to the memory controller 110 during the regulated section T11 to T15, information on whether it is possible/ impossible to transfer the read data, and information on a moment when the read data may be transferred if it is possible to transfer the read data.

According to the first embodiment shown in FIG. 3, the memory module 120 may notify the memory controller 110 that it does not transfer the read data during the regulated section, and the memory controller 110 may check the information on the reason why the memory module 120 does not transfer the read data during the regulated section, and the information on the moment when the read data may be transferred. With the use of the protocol, even though the memory module 120 does not satisfy the latency regulation, it may be possible to flexibly cope with the dissatisfaction situation.

FIG. 4 is a timing diagram illustrating a method for a case that it is impossible for the memory module 120 to transfer read data to the memory controller 110 within a regulated section during a read operation of the memory system 100 shown in FIG. 1, in accordance with a second embodiment of the present invention.

Referring to FIG. 4, the read command RD may be applied from the memory controller 110 to the memory module 120 at the moment T0. Herein, although not illustrated in the drawing, an address for selecting a region where a read operation is to be performed may be applied along with the read command RD.

When the memory module 120 is not able to transfer the read data to the memory controller 110 during the regulated section ranging from the moment T11 to the moment T15, in which the read data is supposed to be transferred, the module controller 130 may inform the memory controller 110 that it is impossible to transfer the read data during the regulated section by fixing the levels of the data strobe signals that are transferred through the data strobe signal transfer lines DQS_LINE<0:7> at low levels during a portion of the regulated section T11 to T15, e.g., from the moment T11 to a moment T13.

During a remaining portion T13 to T15 of the regulated section T11 to T15, status information S may be transferred from the module controller 130 of the memory module 120 to the memory controller 110. The status information S may be transferred through the data strobe signal transfer lines DQS_LINE<0:6>, and the data strobe signal of the data strobe signal transfer line DQS_LINE<7> may toggle in order to strobe the status information S. In other words, the status information S transferred through the data strobe signal transfer lines DQS_LINE<0:6> may be transferred in synchronization with the data strobe signal that is transferred through the data strobe signal transfer line DQS_LINE<7>.

According to the second embodiment shown in FIG. 4, when the memory module 120 is not able to transfer the read data to the memory controller 110 during the regulated section that the read data is supposed to be transferred, the memory module 120 may notify the memory controller 110 that the memory module 120 does not transfer the read data to the memory controller 110 during the regulated section and then transfer the status information S to the memory controller 110 using the data strobe signal transfer line. With the use of the protocol, even though the memory module 120 does not satisfy the latency regulation, it may be possible to flexibly cope with the dissatisfaction situation.

FIG. 5 is a timing diagram illustrating a method for a case that it is impossible for the memory module 120 to transfer read data to the memory controller 110 within a regulated section during a read operation of the memory system 100 shown in FIG. 1, in accordance with a third embodiment of the present invention.

Referring to FIG. 5, the read command RD may be transferred from the memory controller 110 to the memory module 120 at the moment T0. Herein, although not illustrated in the drawing, an address for selecting a region where a read operation is to be performed may be applied along with the read command RD.

When the memory module 120 is not able to transfer the read data to the memory controller 110 during the regulated section T11 to T15, in which the read data is supposed to be transferred, the module controller 130 may inform the memory controller 110 that it is impossible to transfer the read data during the regulated section by fixing the levels of the data strobe signals that are transferred through the data strobe signal transfer lines DQS_LINE<0:7> at low levels during a portion T11 to T13 of the regulated section T11 to T15.

During a remaining portion T13 to T15 of the regulated section T11 to T15, status information S may be transferred from the module controller 130 of the memory module 120 to the memory controller 110. The status information S may be transferred through some data transfer lines DQ_LINE<56:63> among the data transfer lines DQ_LINE<0:63>, and the data strobe signal of the data strobe signal transfer line DQS_LINE<7> may toggle during the remaining portion T13 to T15 in order to strobe the status information S. In other words, the status information S transferred through the data transfer lines DQ_LINE<56:63> may be transferred in synchronization with the data strobe signal that is transferred through the data strobe signal transfer line DQS_LINE<7>.

According to the third embodiment shown in FIG. 5, just like the second embodiment shown in FIG. 4, when the memory module 120 is not able to transfer the read data to the memory controller 110 during a regulated section that the read data is supposed to be transferred, the memory module 120 may be able to notify that the memory module 120 does not transfer the read data to the memory controller 110 during the regulated section by fixing the level of the data strobe signal and then transfer the status information S to the memory controller 110 using the data strobe signal transfer line. With the use of the protocol, even though the memory module 120 does not satisfy the latency regulation, it may be possible to flexibly cope with the dissatisfaction situation.

According to the embodiments of the present invention, the latency concern of a memory module may be addressed.

While the present invention has been described with respect to specific embodiments, it will be apparent to those skilled in the art that various changes and modifications may be made without departing from the spirit and scope of the invention as defined in the following claims.

What is claimed is:

1. An operating method of a memory system comprising a memory controller and a memory module, the method comprising:
by the memory controller, applying a read command to the memory module;
by the memory module, determining whether the memory module is able to transfer the read data to the memory controller during a regulated section;
by the memory module, notifying the memory controller by using a data strobe signal that the memory module is not able to transfer the read data to the memory controller during the regulated section;
by the memory controller, applying a status check-out command to the memory module in response to the notification for checking out a status of the memory module; and
by the memory module, transferring status information of the memory module to the memory controller in response to the status check-out command.

2. The operating method of claim 1, wherein the regulated section ranges from a first moment when a time corresponding to a read latency elapses from when the read command is applied, to a second moment when transferring of the read data corresponding to a burst length is completed.

3. The operating method of claim 1, wherein, in notifying the memory controller that the memory module is not able to transfer the read data to the memory controller during the regulated section by using the data strobe signal,
the memory module fixes the data strobe signal for at least one clock period within the regulated section.

4. The operating method of claim 1, wherein the status information includes information on the reason why the memory module does not transfer the read data to the memory controller during the regulated section, information on whether it is possible/impossible to transfer the read data, and information on a moment when the read data may be transferred if possible.

5. An operating method of a memory system, comprising:
in a memory controller, applying a read command to a memory module;
when the memory module is not able to transfer a read data to the memory controller during a regulated section, in the memory module, notifying the memory controller that the memory module is not able to transfer the read data to the memory controller during the regulated section by using a data strobe signal; and
in the memory module, transferring status information of the memory module to the memory controller after the notification,
wherein the regulated section ranges from a first moment when a time corresponding to a read latency elapses from when the read command is applied, to a second moment when transferring of the read data corresponding to a burst length is completed.

6. The operating method of claim 5, wherein, in notifying the memory controller that the memory module is not able to transfer the read data to the memory controller during the regulated section by using the data strobe signal,
the memory module fixes the data strobe signal during a portion of the regulated section.

7. The operating method of claim 6, wherein the transferring of the status information of the memory module to the memory controller from the memory module after the notification is performed during a remaining portion of the regulated section.

8. The operating method of claim 5, wherein the status information is transferred through a data strobe signal transfer line.

9. The operating method of claim 5, wherein the status information is transferred through a data transfer line.

10. The operating method of claim 5, wherein the status information includes
information on the reason why the memory module does not transfer the read data to the memory controller during the regulated section, information on whether it is possible/impossible to transfer the read data, and information on a moment when the read data may be transferred if possible.

11. A memory system comprising:
a memory module suitable for including a plurality of memory devices and a module controller for controlling the plurality of the memory devices; and
a memory controller suitable for commanding an operation of the memory module,
wherein, during a read operation of the memory module under a control of the module controller, when the memory module is not able to transfer a read data to the memory controller in a regulated section during a read operation, the module controller notifies the memory controller that the memory module is not able to transfer the read data to the memory controller during the regulated section by using a data strobe signal.

12. The memory system of claim 11, wherein the regulated section ranges from a first moment when a time corresponding to a read latency elapses from when the memory controller commands the memory module to perform the read operation, to a second moment when transferring of the read data corresponding to a burst length is completed.

13. The memory system of claim 11, wherein, the module controller notifies the memory controller that the memory module is not able to transfer the read data to the memory controller during the regulated section by fixing the data strobe signal for at least one or more clock period within the regulated section.

14. The memory system of claim 11, wherein the memory controller applies a status check-out command to the module controller to check out a status of the memory module, in response to the notification.

15. The memory system of claim 14, wherein the module controller transfers status information of the memory module to the memory controller in response to the status check-out command.

16. The memory system of claim 15, wherein the status information includes information on the reason why the memory module does not transfer the read data to the memory controller during the regulated section, information on whether it is possible/impossible to transfer the read data, and information on a moment when the read data may be transferred if possible.

17. The memory system of claim 11, wherein the notification that the memory module is not able to transfer the read data to the memory controller during the regulated section is performed by the module controller fixing the data strobe signal during a portion of the regulated section, and
the module controller transfers status information of the memory module to the memory controller in a remaining portion of the regulated section.

18. The memory system of claim 17, wherein the status information is transferred through a data strobe signal transfer line.

19. The memory system of claim 17, wherein the status information is transferred through a data transfer line.

* * * * *